United States Patent
Sawada et al.

(10) Patent No.: US 10,957,244 B2
(45) Date of Patent: Mar. 23, 2021

(54) LED DISPLAY SYSTEM AND LED DISPLAY DEVICE

(71) Applicant: MITSUBISHI ELECTRIC CORPORATION, Tokyo (JP)

(72) Inventors: Kiyoshi Sawada, Tokyo (JP); Yoshinori Asamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/635,365

(22) PCT Filed: Sep. 11, 2017

(86) PCT No.: PCT/JP2017/032640
§ 371 (c)(1),
(2) Date: Jan. 30, 2020

(87) PCT Pub. No.: WO2019/049358
PCT Pub. Date: Mar. 14, 2019

(65) Prior Publication Data
US 2020/0202770 A1    Jun. 25, 2020

(51) Int. Cl.
*G09G 3/32*    (2016.01)
(52) U.S. Cl.
CPC ....... *G09G 3/32* (2013.01); *G09G 2320/0233* (2013.01); *G09G 2320/0626* (2013.01)
(58) Field of Classification Search
CPC ............ G09G 3/32; G09G 2320/0233; G09G 2320/0626
See application file for complete search history.

(56) References Cited

U.S. PATENT DOCUMENTS

| 7,646,362 B2 * | 1/2010 | Mizukoshi ........... G09G 3/3291 345/76 |
| 9,529,562 B2 * | 12/2016 | Takahashi ............... G09G 5/10 |
| 2015/0181133 A1 * | 6/2015 | Ogushi .................. H04N 5/268 348/705 |

FOREIGN PATENT DOCUMENTS

| JP | 5-35194 A | 2/1993 |
| JP | 4808913 B2 | 11/2011 |

(Continued)

OTHER PUBLICATIONS

International Search Report, issued in PCT/JP2017/032640, dated Dec. 12, 2017.

*Primary Examiner* — Kenneth B Lee, Jr.
(74) *Attorney, Agent, or Firm* — Birch, Stewart, Kolasch & Birch, LLP.

(57) ABSTRACT

In an LED display system, an object of the present invention is to provide a technique capable of suppressing power consumption of a plurality of LED display devices by synchronizing power saving control by each controller. Each controller includes a control circuit, a signal line, an average brightness value communication unit, and a video signal distribution unit. The control circuit calculates an average brightness value Yave of pixels constituting a frame and generates a READY signal. The average brightness value communication unit outputs the average brightness value to the signal line after detecting the completion of calculation of the average brightness values of all the controllers. The control circuit calculates a common brightness correction coefficient Cy based on the average brightness value Yave. The video signal distribution unit distributes the video signal and the common brightness correction coefficient Cy to the single LED unit.

4 Claims, 10 Drawing Sheets

(56) References Cited

FOREIGN PATENT DOCUMENTS

JP 2013-97205 A 5/2013
WO WO 2013/183139 A1 12/2013

* cited by examiner

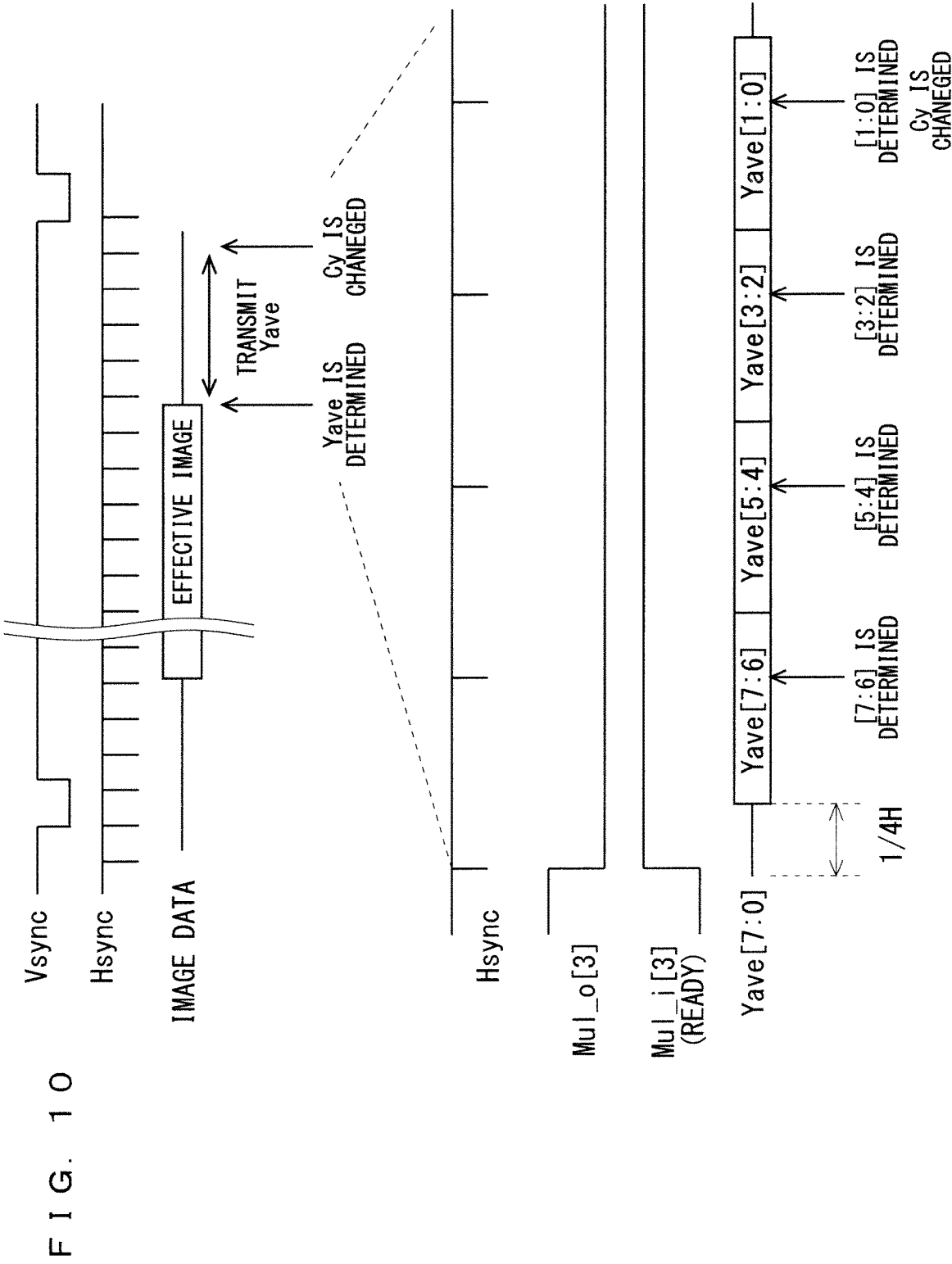

LED DISPLAY SYSTEM AND LED DISPLAY DEVICE

TECHNICAL FIELD

The present invention relates to an LED display system including a controller and an LED display device that displays video by controlling blinking of individual Light Emitting Diodes (LED) based on video signals distributed from the controller, in particular, to an LED brightness control technique.

BACKGROUND ART

The LED display device includes a plurality of LEDs as display pixels, and is widely used for advertising display indoors and outdoors due to the development of LED technology and cost reduction. Until now, LED display devices had mainly displayed nature images and moving images such as animations. However, as the viewing distance is shortened as the pixel pitch becomes narrower, LED display devices have been also used for indoor applications such as conferences and monitoring. Particularly in monitoring applications, opportunities have been increasing where LED display devices display images that are almost still images input from, for example, a personal computer.

As display pixels of an LED display device, LEDs of three primary colors of R, G, and B are generally used. In an LED display device, color tone is expressed by Pulse Width Modulation (PWM) control of the light emission time of LEDs of each color R, G, and B. However, LEDs consume maximum power in the lighting state and consume almost no power in the non-lighting state; therefore, with respect to a full-bit all-white signal, the power consumption of the LED with a gray signal of 20% is about 20%, for example. Accordingly, in the LED display device, power consumption varies greatly depending on the content of the video signal. And with the full-bit all-white signal, LEDs of each color R, G, and B emit light at a duty ratio of 100%, and with the 20% gray signal, the LEDs of each color R, G, B emit light at a duty ratio of 20%.

Accordingly, Patent Document 1 discloses a display device that realizes power saving while suppressing an increase in power supply capacity. In the display device described in Patent Document 1, the value of the current flowing through the display panel is estimated based on an input video signal. When the sum of current values in each frame unit exceeds a predetermined threshold value, the display device performs video signal processing for correcting the contrast and brightness of the image to prevent the current value flowing through the display panel from exceeding a predetermined maximum value.

PRIOR ART DOCUMENTS

Patent Documents

[Patent Document 1] Japanese Patent No. 4808913

SUMMARY

Problem to be Solved by the Invention

In general, a large screen is formed by using a plurality of LED display devices. For example, a Full HD (1920×1080 pixels) image is displayed by combining a total of 36 units of 320×180 pixel LED display devices of 6 units in horizontal direction×6 units in vertical direction. Each LED display device consumes the maximum power when displaying a full-bit all-white signal and the amount of power consumption becomes the rated value. Therefore, in the system having the Full HD resolution as described above, it is necessary to prepare the power capacity for an LED device power consumption×36 units.

However, many of images displayed for monitoring application or the like are typically gray background images, light-colored images, or the like that can be displayed with relatively low power consumption, and preparing LED display devices with the maximum power capacity calculated from the rated value turns out excessive capacity. In addition, there is a problem that additional power construction may be required when the established equipment capacity is insufficient even though the capacity is excessive.

Here, the technique described in Patent Document 1 is a technique related to only an LED display device, and does not relate to an LED display system including a controller and an LED display device that displays an image based on a video signal from the controller. Therefore, when a plurality of LED display devices display an image, for example, a large screen is formed by a plurality of LED display devices, in the technique described in Patent Document 1, power saving control is performed in each LED display device. As a result, there has been a problem that the brightness of a plurality of LED display devices cannot be controlled at a time, for example, due to the reduced brightness that is caused in only one of the LED display devices by power saving control.

Therefore, according to the present invention, in an LED display system including a plurality of controllers and an LED display device that displays video based on a video signal distributed from the plurality of controllers, an object of the present invention is to provide a technique capable of suppressing power consumption of a plurality of LED display devices by synchronizing power saving control by each controller.

Means to Solve the Problem

An LED display system according to the present invention is an LED display system including a plurality of controllers and an LED display device configured to display a video based on a video signal distributed from the plurality of controllers. Each of the controllers includes an average brightness calculation unit configured to calculate an average brightness value of pixels constituting a frame for each frame in the video signal and generate a control signal indicating completion of calculation of the average brightness value, a signal line wired-OR connected to the other controllers, an average brightness value communication unit configured to share the average brightness value and the control signal with the other controllers via the signal line and output the average brightness value to the signal line after detecting the completion of calculation of the average brightness values of all the controllers by the control signal, a correction coefficient calculation unit configured to calculate a brightness correction coefficient common to all the controllers for correcting the brightness of the video signal so that power consumption of the LED display device becomes equal to or lower than a predetermined value based on the average brightness value calculated by the average brightness calculation unit via the signal line, and a video signal distribution unit configured to distribute the video signal and the common brightness correction coefficient to the LED display device. The LED display device includes a plurality of LEDs serving as display pixels, a brightness adjustment unit configured to adjust the brightness of the video signal distributed from the video signal distribution unit based on the common brightness correction coefficient distributed from the video signal distribution unit, and an LED drive unit configured to drive the plurality of LEDs based on the video signal of which brightness has been adjusted by the brightness adjustment unit.

Effects of the Invention

According to the present invention, each controller detects the completion of calculation of the average brightness value of all the controllers based on the control signal, and then outputs the average brightness value to the signal line, and calculates a brightness correction coefficient, which is in common for all controllers and is the coefficient for correcting the brightness of the video signal so that the power consumption of the LED display device becomes equal to or lower than a predetermined value. The LED display device adjusts the brightness of the video signal based on the common brightness correction coefficient calculated in each controller. Thereby, even when a plurality of LED display devices are provided, the power saving control by each controller can be synchronized and the power consumption can be suppressed to a predetermined value or lower.

These and other objects, features, aspects and advantages of the present invention will become more apparent from the following detailed description of the present invention when taken in conjunction with the accompanying drawings

BRIEF DESCRIPTION OF DRAWINGS

[FIG. 10] An explanatory diagram for explaining timing for calculating a common brightness correction coefficient based on an average brightness value input via a signal line according to Modification of Embodiment 1. Description of Embodiments

EMBODIMENT 1

Embodiment 1 of the present invention will be described with reference to the drawings.

(Configuration of LED Display System)

Figure 1:
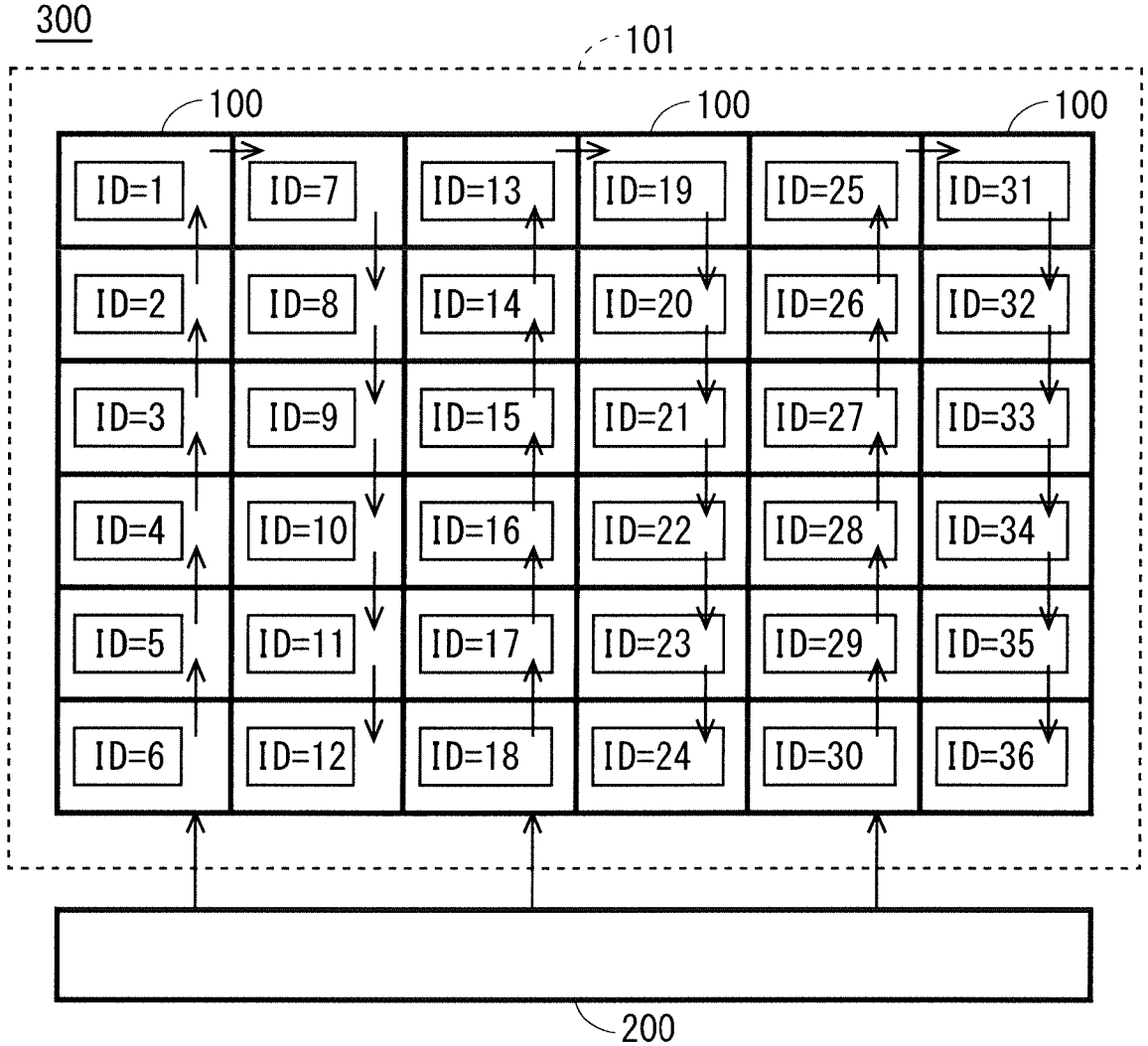
[FIG. 1] A configuration diagram of an LED display system according to Embodiment 1.

First, a whole configuration of an LED display system according to Embodiment 1 of the present invention will be described. FIG. 1 is a configuration diagram of an LED display system 300.

As shown in FIG. 1, the LED display system 300 includes an LED unit 101 and a controller 200. The LED unit 101 displays video based on a video signal distributed from the controller 200.

The LED unit 101 includes a plurality of LED display devices (hereinafter also referred to as "single LED unit") 100, and one screen is formed with a plurality of LED display units 5 (see FIG. 2) respectively included in a plurality of single LED units 100. In the example of FIG. 1, in the LED unit 101, one screen is formed with the total of 36 single LED units 100 of 6 units in horizontal direction×6 units in vertical direction.

In Embodiment 1, the pixel configuration of the single LED unit 100 is 320 pixels in the horizontal direction×180 pixels in the vertical direction, and the LED unit 101 displays Full HD (1920×1080 pixels) by the 36 units of the single LED units 100.

The controller 200 distributes the video signal to the LED unit 101 and controls the LED unit 101. In Embodiment 1, the controller 200 controls a plurality of single LED units 100; therefore, a plurality of single LED units 100 are daisy-chain connected in three groups. The video signal and a control signal from the controller 200 are sequentially input to the single LED units 100 in each group. Note that a method by which the controller 200 controls each single LED unit 100 will be described in detail later.

(Configuration of Single LED unit)

Figure 2:
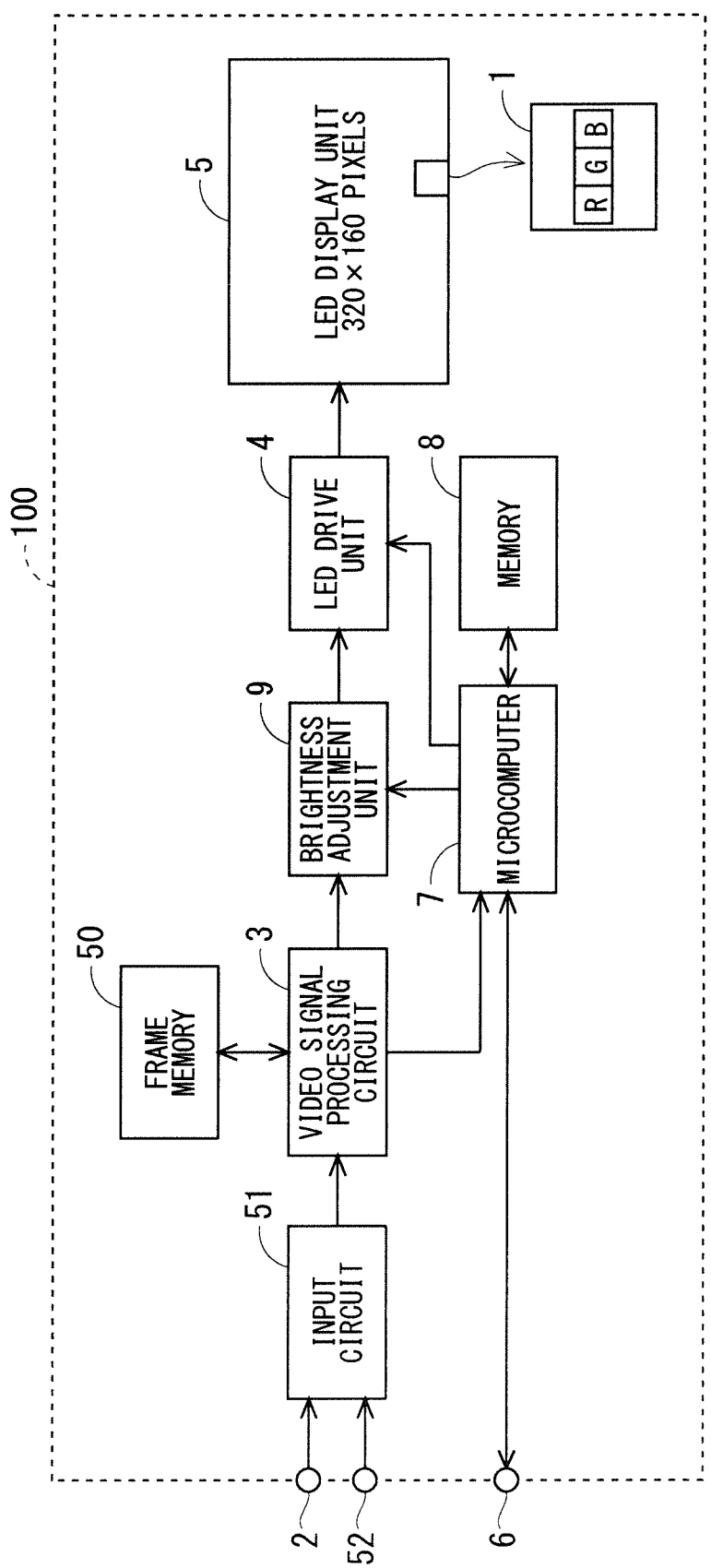
[FIG. 2] A block diagram of the inside of a single LED unit.

FIG. 2 is a block diagram of the inside of a single LED unit 100. As shown in FIG. 2, the single LED unit 100 includes a video input terminal 2, a video output terminal 52, an input circuit 51, a video signal processing circuit 3, a frame memory 50, a brightness adjustment unit 9, an LED drive unit 4, and an LED display unit 5, a microcomputer 7, a memory 8, and a control terminal 6. In order to reduce the number of signal lines constituting a transmission path connecting the controller 200 and the single LED unit 100, the controller 200 encodes the video signal into a serial signal and outputs this signal. The serial signal output from the controller 200 is input to the video input terminal 2.

The input circuit 51 decodes the serial signal input via the video input terminal 2 and outputs the signal to the video signal processing circuit 3, and buffers the serial signal and outputs the signal as it is via the video output terminal 52 without decoding the signal. The serial signal output from the video output terminal 52 is input to the video input terminal 2 of the single LED unit 100 at the next stage as a signal for daisy chaining.

The video signal processing circuit 3 uses the frame memory 50 to perform signal processing such as processing for selecting a region necessary for displaying from the video signal decoded by the input circuit 1. The brightness adjustment unit 9 adjusts the brightness of the video signal that has been subjected to signal processing by the video signal processing circuit 3 based on the brightness correction coefficient distributed from the controller 200.

The LED drive unit 4 drives the LED display unit 5 by PWM based on the video signal of which brightness has been adjusted by the brightness adjustment unit 9. The LED display unit 5 is configured by arranging LEDs 1 serving as display pixels in a matrix of 320 pixels in a horizontal direction×180 pixels in a vertical direction. An LED 1 includes three LEDs of red (R), green (G), and blue (B) per pixel. The LED drive unit 5 is driven by the LED driving unit 4 based on the video signal of which brightness has been adjusted by the brightness adjustment unit 9 and displays the video.

The control terminal 6 is a terminal that serves as an input/output terminal for the control signal between the controller 200 and the single LED unit 100. The microcomputer 7 controls the video signal processing circuit 3, the brightness adjustment unit 9, and the LED driving unit 4. Further, the microcomputer 7 acquires setting information distributed from the controller 200 via the control terminal 6 and stores the information in the memory 8.

(Configuration of Controller)

Figure 3:
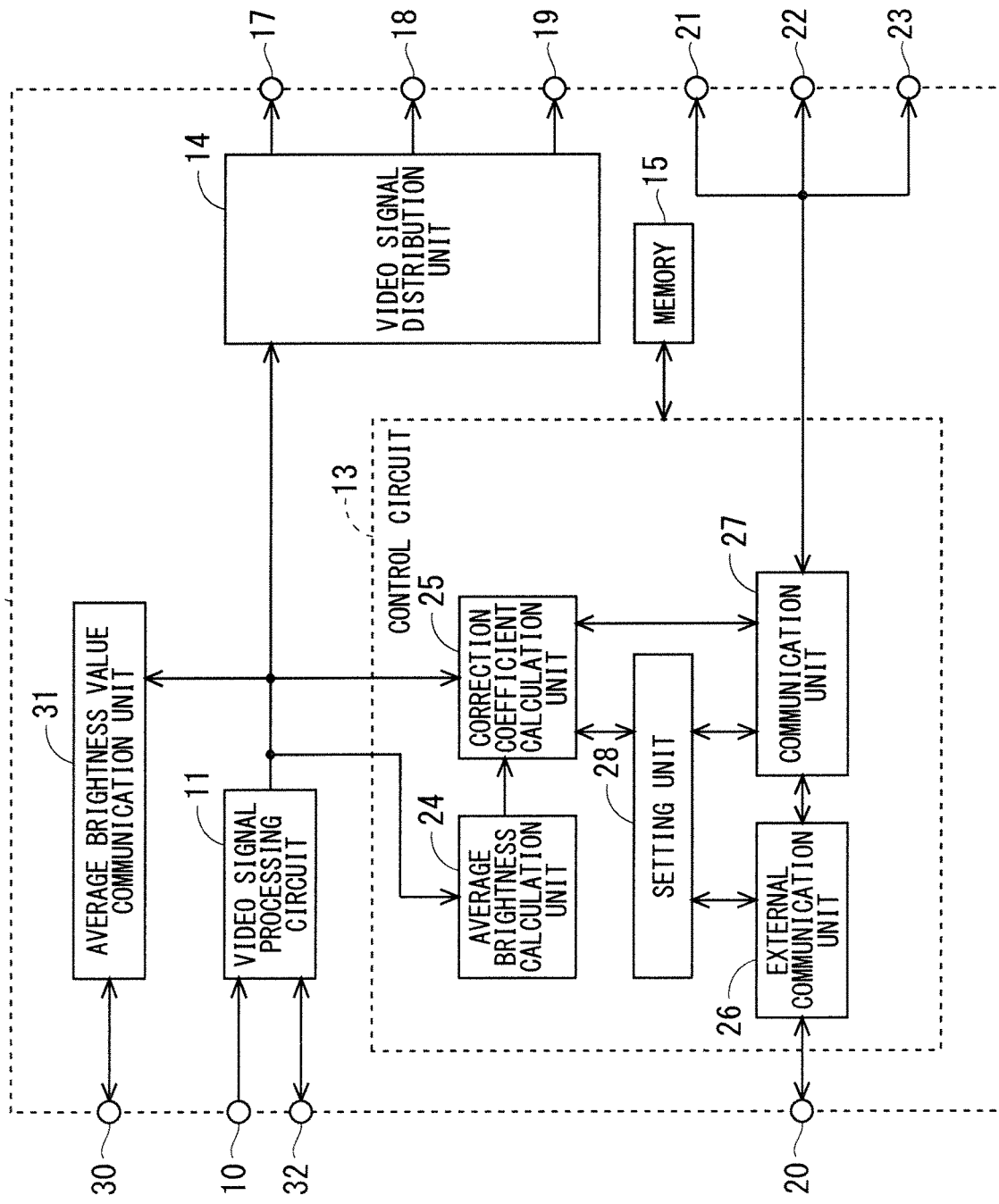
[FIG. 3] A block diagram of the inside of a controller.

FIG. 3 is a block diagram of the inside of the controller 200. As shown in FIG. 3, the controller 200 includes a video input terminal 10, a video signal processing circuit 11, a video signal distribution unit 14, a memory 15, a control circuit 13, video output terminals 17, 18, 19, control terminals 21, 22, 23, an external terminal 20, an external synchronization signal input/output terminal 32, an average brightness value communication unit 31, and an average brightness value input/output terminal 30.

A video signal from an external device such as a PC is input to the video input terminal 10. The video signal processing circuit 11 performs video signal processing such as gamma correction on the video signal input via the video input terminal 10. The video signal distribution unit 14 divides the video signal that has been subjected to the signal processing by the video signal processing circuit 11 and distributes the signals to the LED unit 101 via the video output terminals 17 to 19. In this case, in order to reduce the number of signal lines constituting a transmission path connecting the controller 200 and the single LED unit 100, the controller 200 encodes the video signal into a serial signal and outputs this signal.

Further, in order to synchronize the outputs of a plurality of controllers 200, the video signal processing circuit 11 has a function of synchronizing with an external synchronization signal input/output from the external synchronization signal input/output terminal 32. The operation of the external synchronization function will be described in detail later.

The control circuit 13 includes an average brightness calculation unit 24, a correction coefficient calculation unit 25, an external communication unit 26, a communication unit 27, and a setting unit 28.

The average brightness calculation unit 24 calculates an average brightness value of pixels constituting a frame for each frame in the video signal subjected to signal processing by the video signal processing circuit 11. The correction coefficient calculation unit 25 calculates a brightness correction coefficient for correcting the brightness of the video signal so that the power consumption of the LED unit 101 becomes equal to or lower than a predetermined value based on the average brightness value calculated by the average brightness calculation unit 24. Furthermore, the calculation result of the average brightness calculation unit 24 can synchronize the power saving control of a plurality of controllers 200 via the average brightness value communication unit 31 and the average brightness value input/output terminal 30. The operations of the average brightness calculation unit 24 and the correction coefficient calculation unit 25 will be described in detail later. Further, the power saving control of a plurality of controllers 200 will be described in detail later.

The external communication unit 26 receives a control signal for controlling the controller 200 and the single LED unit 100 input from an external device such as a PC via the external terminal 20. The communication unit 27 transmits and receives the control signal to and from the single LED units 100 via the control terminals 21 to 23.

It should be noted that, each function of the average brightness calculation unit 24, the correction coefficient calculation unit 25, the external communication unit 26, the communication unit 27, and the setting unit 28 is realized by the control circuit 13. The control circuit 13 may be dedicated hardware, or a Central Processing Unit (also referred to as CPU, a central processing unit, a processing unit, an arithmetic unit, a microprocessor, a microcomputer, a processor, or DSP) that executes a program stored in the memory 15.

When a dedicated hardware is applied to the control circuit 13, a single circuit, a composite circuit, a programmed processor, a parallel programed processor, an ASIC, an FPGA, or combinations thereof correspond to the control circuit 13. Each function of the average brightness calculation unit 24, the correction coefficient calculation unit 25, the external communication unit 26, the communication unit 27, and the setting unit 28 may be realized by integrally realized by the control circuit 13, or each function may also be realized in respective processing circuits.

When the control circuit 13 is a CPU, each function of the average brightness calculation unit 24, the correction coefficient calculation unit 25, the external communication unit 26, the communication unit 27, and the setting unit 28 is realized by software, firmware, or, a combination of software and firmware. Software and firmware are written as program and stored in the memory 15. The control circuit 13 reads out and executes the program stored in the memory 15, thereby realizing the function of each unit. And it can be said that the program causes the computer to execute procedures and methods of the average brightness calculation unit 24, the correction coefficient calculation unit 25, the external communication unit 26, the communication unit 27, and the setting unit 28.

Note that some of the functions of the average brightness calculation unit 24, the correction coefficient calculation unit 25, the external communication unit 26, the communication unit 27, and the setting unit 28 may be realized by dedicated hardware, and the rest may be realized by software or firmware.

(Brightness Correction Method of LED)

Next, a Brightness correction method of the LED 1 in the LED display system 300 according to Embodiment 1 will be described in detail.

As shown in FIG. 1, when an LED display system 300 is configured by including a controller 200 and an LED unit 101 formed of 36 single LED units 100, an ID number is set in each single LED unit 100 for the controller 200 to control the single LED units 100 individually. In the example of FIG. 1, IDs=1 to 36 are set for 36 single LED units 100, respectively. The ID information of the single LED unit 100 is stored in its own memory 8.

In the example of FIG. 1, the LED unit 101 is divided into three groups of a group composed of the single LED units 100 with IDs=1 to 12, a group composed of the single LED units 100 with IDs=13 to 24, and a single LED units 100 with IDs=25 to 36. The three single LED units 100 with ID=6, ID=18, and ID=30 are connected to the controller 200.

Specifically, the video output terminals 17 to 19 of the controller 200 are connected to the video input terminals 2 of the single LED units 100 with IDs=6, 18, 30 respectively. Similarly, the control terminals 21 to 23 of the controller 200 are connected to the control terminals 6 of the single LED units 100 with IDs=6, 18, 30 respectively.

As shown in FIG. 3, in the controller 200, the video signal input from the video input terminal 10 is converted into the resolution of the LED unit 101 as the output destination in addition to being subjected to processing such as gamma correction by the video signal processing circuit 11. In Embodiment 1, this resolution is 1920×1080 pixels (Full HD).

The video signal subjected to signal processing by the video signal processing circuit 11 is divided into three areas of 640×1080 pixels by the video signal distribution unit 14. The video signals divided into the three areas are distributed to three groups of single LED units 100 with IDs=1 to 12, 13 to 24, and 25 to 36, respectively.

The video signal subjected to signal processing by the video signal processing circuit 11 is distributed to the LED unit 101 by the video signal distribution unit 14. And the average brightness value of pixels constituting a frame for each frame in the video signal is calculated in the average brightness calculation unit 24.

(Calculation Method of Average Brightness Value)

Hereinafter, a calculation method of the average brightness value will be described in detail. In Embodiment 1, the resolution of the video signal subjected to signal processing by the video signal processing circuit 11 as described above is 1920×1080 pixels. R, G, and B brightness values are output for each pixel. Setting that the LED unit 101 display screen upper left coordinates are (h, v)=(1,1), lower right coordinates are (h, v)=(1920,1080) and the brightness values of R, G, and B colors for each pixel are expressed as Yr (h, v), Yg (h, v), and Yb (h, v).

The average brightness calculation unit 24 performs the following calculation.

[Equation 1]
$$Yr(0, 0) = Yr(1, 1) + Yr(1, 2) + \ldots Yr(1, 1080) + \\ Yr(2, 1) + Yr(2, 2) + \ldots Yr(2, 1080) \\ \vdots \\ + Yr(1920, 1) + Yr(1920, 2) + \ldots Yr(1920, 1080) \quad (1)$$

[Equation 2]
$$Yg(0, 0) = Yg(1, 1) + Yg(1, 2) + \ldots Yg(1, 1080) + \\ Yg(2, 1) + Yg(2, 2) + \ldots Yg(2, 1080) \\ \vdots \\ + Yg(1920, 1) + Yg(1920, 2) + \ldots Yg(1920, 1080) \quad (2)$$

[Equation 3]
$$Yb(0, 0) = Yb(1, 1) + Yb(1, 2) + \ldots Yb(1, 1080) + \\ Yb(2, 1) + Yb(2, 2) + \ldots Yb(2, 1080) \\ \vdots \\ + Yb(1920, 1) + Yb(1920, 2) + \ldots Yb(1920, 1080) \quad (3)$$

[Equation 4]
$$Yall = (Yr(0, 0) + Yg(0, 0) + Yb(0, 0))/3 \quad (4)$$

[Equation 5]
$$Yave = Yall/(1920 \times 1080) \quad (5)$$

The average brightness value Yave for one frame is obtained by the above equations (1) to (5). At this time, the brightness values of the final pixel Yr (1920, 1080), Yg (1920, 1080), and Yb (1920, 1080) for one frame have already been distributed to the LED unit 101 side. Note that, although in the above equations (1) to (5), the average brightness value Yave is obtained by adding the brightness information of each of R, G, and B for one frame, the result thereof are added for three colors, and dividing the value by the number of pixels. However, the method is not limited thereto. For example, the average brightness value Yave for one horizontal line obtained by adding the brightness values of each R, G, and B for each horizontal line and dividing the value by 1980 is calculated, and the value obtained by adding these values for one frame is divided by the number of vertical lines 1080; thereby, improvement of the calculation efficiency of the average brightness calculation unit 24 is ensured.

Here, the brightness values Yr (h, v), Yg (h, v), Yb (h, v) of each color of R, G, B are 8 bits (values from 0 to 255), that is, 256 gradations. Then, the average brightness value Yave for one frame is in the range of 0 to 255.

The setting unit 28 includes a memory, and a power control adjustment value P is set in the setting unit 28. For example, an external device such as a PC is connectable to the external terminal 20. The user can set the power control adjustment value P in advance through the external terminal 20 and the external communication unit 26 by operating the external device.

With the power control adjustment value P, about what percentage or less the product is to be used when all pixels are lit at the maximum brightness value (R=255, G=255, B=255), that is, for the maximum power consumption of the all-white full-bit signal which is the rated value of the product is set. The power control adjustment value P is set such that P=50%.

The correction coefficient calculation unit 25 determines the brightness correction coefficient Cy to be distributed to the single LED unit 100 based on the power control adjustment value P set in the setting unit 28 and the average brightness value Yave calculated for each frame. Specifically, the correction coefficient calculation unit 25 determines the brightness correction coefficient Cy that lowers the average brightness of one frame equal to or lower than a threshold value when the threshold value is set to 127.5 which is 50% of the maximum value 255 which is the maximum value the average brightness value Yave can take and the average brightness value Yave for each frame exceeds 127.5. Further, the correction coefficient calculation unit 25 inputs the determined brightness correction coefficient Cy to the video signal distribution unit 14.

Here, assuming that the brightness correction coefficient Cy is 9-bit accuracy,

Cy=256 when Yave≤255×P

When Yave>255×P, Equation (6) is used for calculation. For example, Cy=128, when Yave=255.

[Equation 6]

$$Cy = 256 \times (255 \times P)/Yave \quad (6)$$

As described above, although in order to calculate the average brightness value Yave for one frame, video data for one frame is required, the video signal output from the video signal processing circuit 11 is input to the average brightness calculation unit 24 and the video signal distribution unit 14 simultaneously in time series. When the brightness correction coefficient Cy for one frame is determined, the video signal is distributed to the LED unit 101 via the video signal distribution unit 14.

Figure 4:
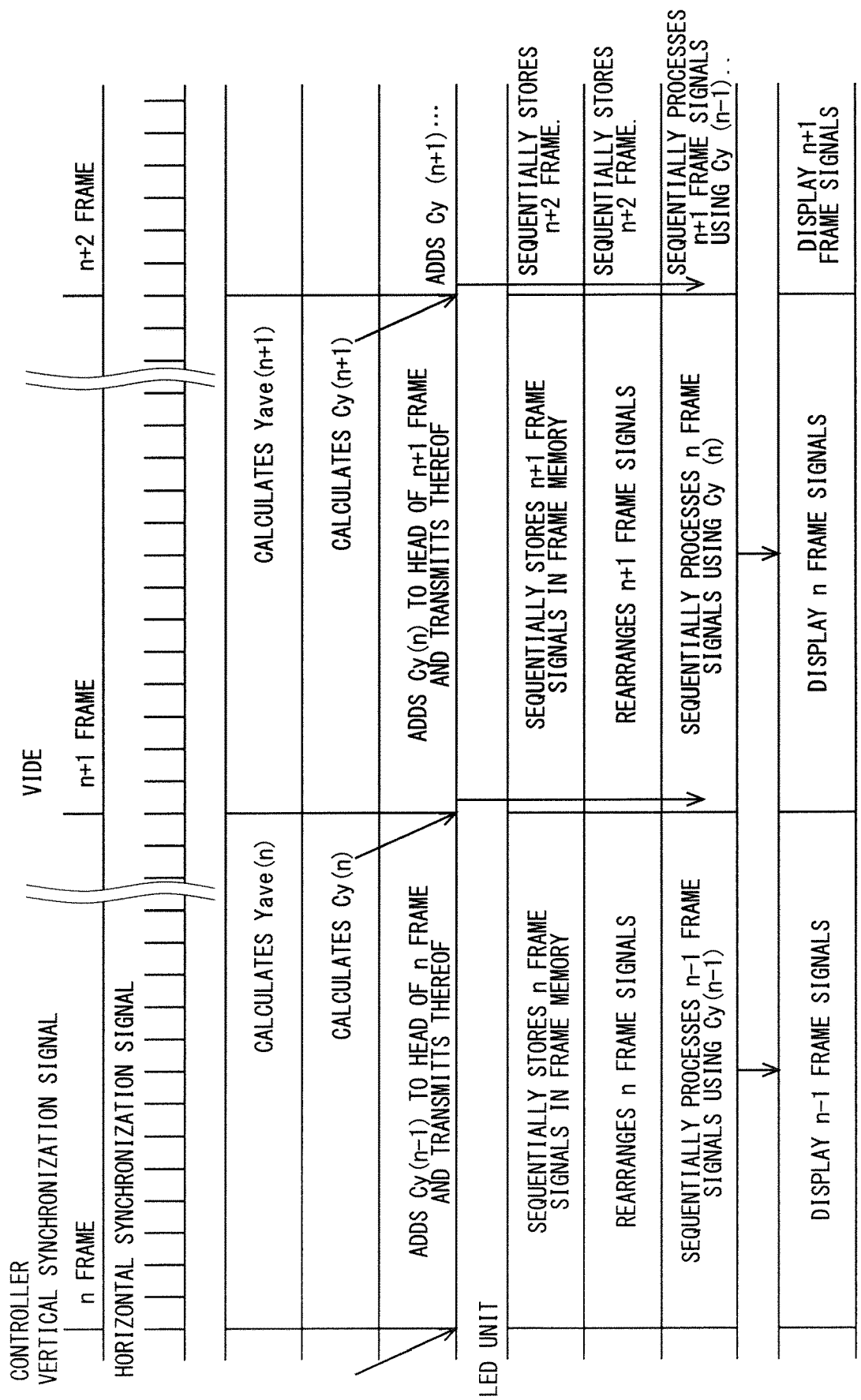
[FIG. 4] A timing chart illustrating signal processing in the LED display system.

As shown in FIG. 4, the brightness correction coefficient Cy is added to the head of the next frame of the frame of which average brightness value Yave is obtained as described above, that is before Yr (1,1), Yg (1,1), Yb (1,1), and distributed to the LED unit 101 side via the video signal distribution unit 14.

The brightness correction coefficient Cy is distributed to the LED unit 101 side with a delay for one frame with respect to the video data. FIG. 4 is a timing chart of signal processing in the LED display system 300.

The video signal processing circuits 3 of the single LED units 100 with IDs=6 to 12 sequentially receive, as the video signal of the nth flame, Yr(n)(h,v), Yg(n)(h,v), Yb(n)(h,v) up to (h,v)=(1,1) to (640,1080). Further, the video signal processing circuit 3 selects a portion to be displayed based on the video signal distributed by its own ID number stored in the memory 8.

Specifically, for example, in the single LED unit 100 with ID=1, the video signal processing circuit 3 selects a signal region of (h,v)=(1,1) to (640,180). Similarly, in the single LED unit 100 with ID=2, a signal region of (h,v)=(1,181) to (640,360), in the single LED unit 100 with ID=3, a signal region of (h,v)=(1,361) to (640,540), in the single LED unit 100 with ID=4, a signal region of (h,v)=(1,541) to (640,720), in the single LED unit 100 with ID=5, a signal region of (h,v)=(1,721) to (640,900), and in the single LED unit 100 with ID=6, a signal region of (h,v)=(1,901) to (640,1080) are selected, respectively. The same processing as described above is performed in the single LED units 100 with IDs=13 to 24 and IDs=25 to 36.

Further, the LED drive unit 4 needs to control the LED display unit 5 by PWM driving the video signal in a time division manner. Therefore, the video signal processing circuit 3 rearranges the video signals input in time series at timing required by the LED drive unit 4 via the frame memory 50. That is, in the video signal processing circuit 3, a delay for one frame occurs when the video signals are rearranged.

The video information of the (n+1)th frame is distributed as data to be distributed from the controller 200 to the video signal processing circuit 3, and a brightness correction coefficient Cy(n) related to the video signal of the nth frame is added to the head thereof.

The microcomputer 7 reads the brightness correction coefficient Cy(n) related to the nth frame. The brightness adjustment unit 9 performs brightness correction of a brightness value Yr(n)(h,v), Yg(n)(h,v), Yb (n)(h,v) of the video signal output from the video signal processing circuit 3 with a delay for one frame using Equation (7).

[Equation 7]

$$\begin{cases} Yro(n)(h, v) = Yr(n)(h, v) \times Cy(n)/256 \\ Ygo(n)(h, v) = Yr(n)(h, v) \times Cy(n)/256 \\ Ybo(n)(h, v) = Yr(n)(h, v) \times Cy(n)/256 \end{cases} \quad (7)$$

The brightness signals Yro(n), Ygo(n), Ybo(n) subjected to the above processing in the brightness adjusting unit 9 are output to the LED drive unit 4 and displayed on the LED display unit 5 as images.

In the above, although the video signal is delayed for one frame by the frame memory 50 in the single LED unit 100, it is not always necessary to delay for one frame, and it is sufficient that the video data input to the single LED unit 100 and the brightness correction coefficient Cy(n) are controlled so as to coincide with time.

As described above, all video data is required to calculate the average brightness value Yave for one frame; therefore, a delay for one frame occurs. Therefore, in order to distribute the brightness correction coefficient Cy and the video signal at the same timing, it is necessary to delay the video signal by one frame in the controller 200. In Embodiment 1, however, the timing of one frame delay in the controller 200 is adjusted using the frame delay in the single LED unit 100; therefore, power control can be performed by frame without adding a frame memory to the controller 200.

That is, the controller 200 calculates the average brightness value Yave for each frame, adds the brightness correction coefficient Cy determined based on the average brightness value Yave and the desired power control adjustment value P to the head of the next frame, and distributes it to the next frame. The single LED unit 100 performs brightness adjustment using the brightness correction coefficient Cy added to the head of the next frame while delaying one frame in order to perform processing such as cutting out the distributed video signal. Thereby, the power consumption below the desired power control adjustment value P for every frame is achieved.

Therefore, even if a video signal that instantaneously increases power consumption is input, the power consumption can be reduced by frame, and the LED display system 300 is controlled so that the power consumption is constantly below a certain level. Therefore, without unnecessarily reducing the brightness of video signals of which power consumption is not large, holding minimized brightness reduction in the whole LED display system 300 is ensured.

(Effect)

As described above, in the LED display system 300 according to Embodiment 1, the single LED unit 100 adjusts brightness of a video signal based on the brightness correction coefficient Cy for correcting the brightness of the signal so that the power consumption calculated in the controller 200 to be a predetermined value or lower. As a result, the power consumption of the LED unit 101 can be suppressed to a predetermined value or less. That is, power saving control can be performed in the LED display system 300.

As described above, energy consumption in the LED display system 300 can be reduced.

(Configuration with Multiple Controllers and Multiple LED Units)

Figure 5:
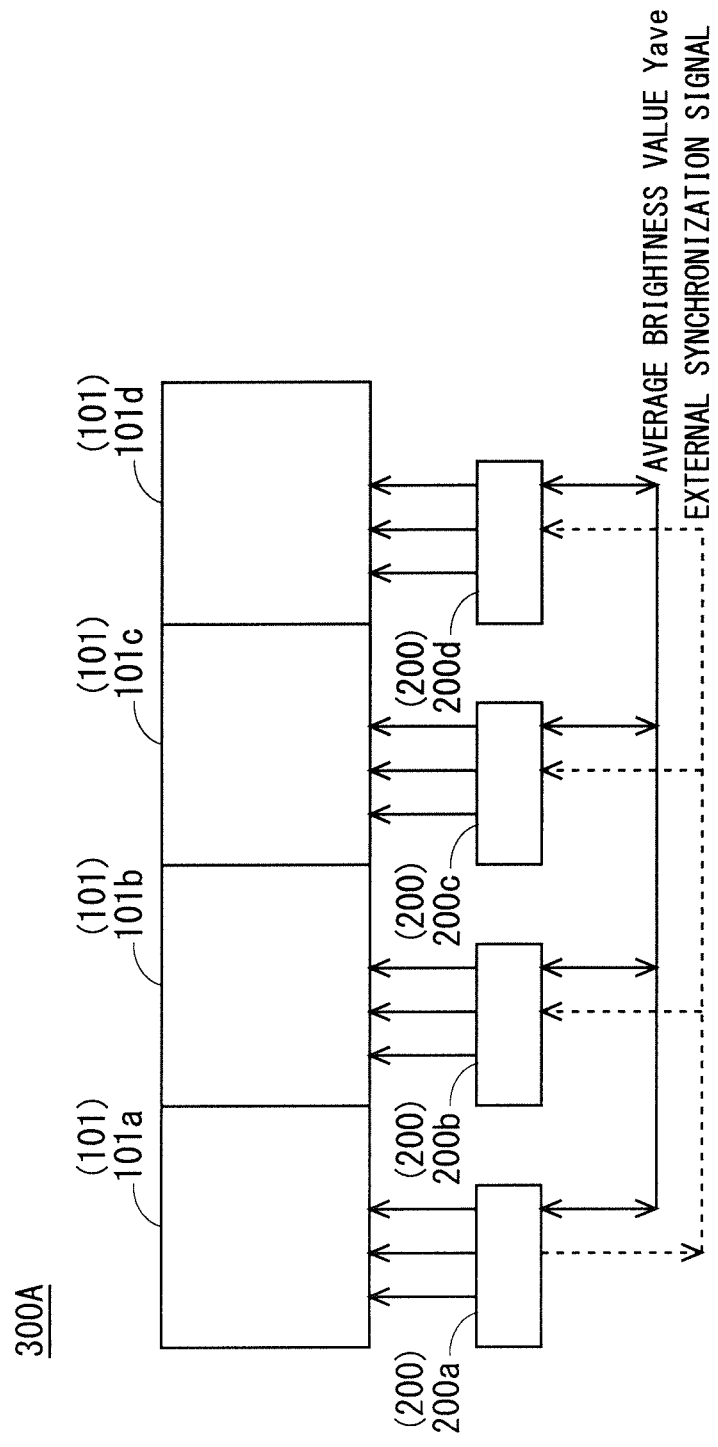
[FIG. 5] A configuration diagram of an LED display system including a plurality of controllers.
Figure 6:
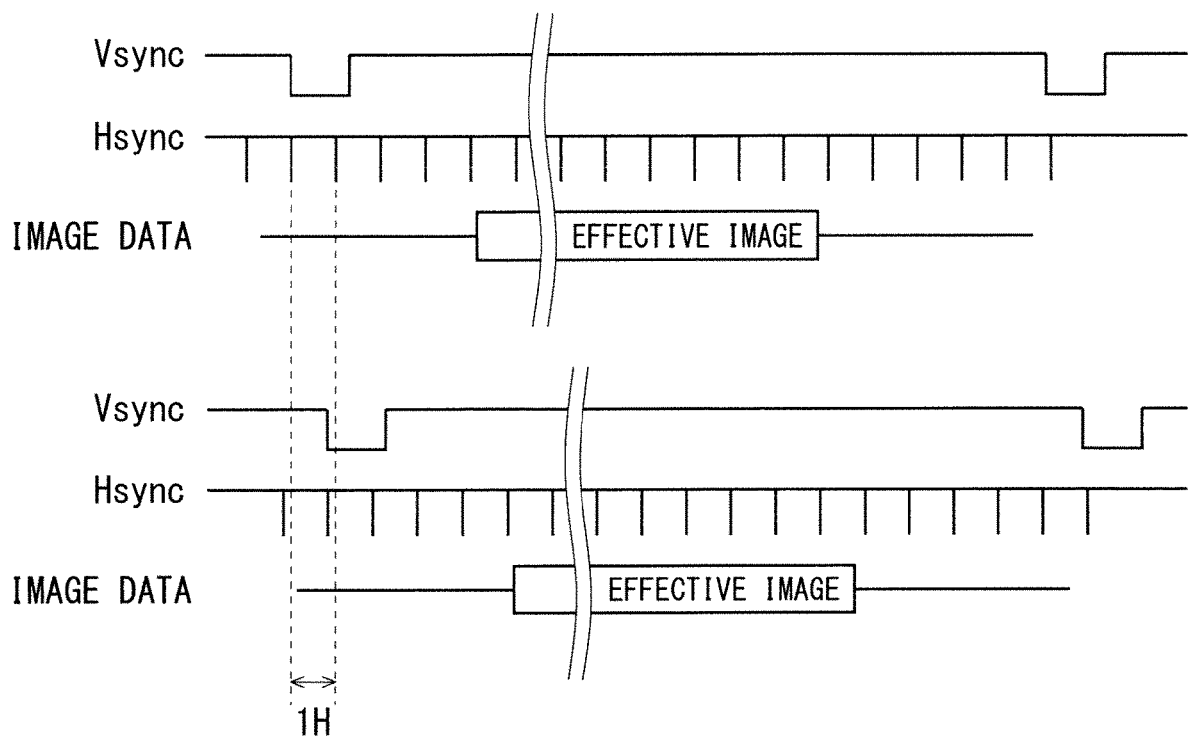
[FIG. 6] A diagram illustrating an example of a vertical synchronization signal and a horizontal synchronization signal in the controller.
Figure 7:
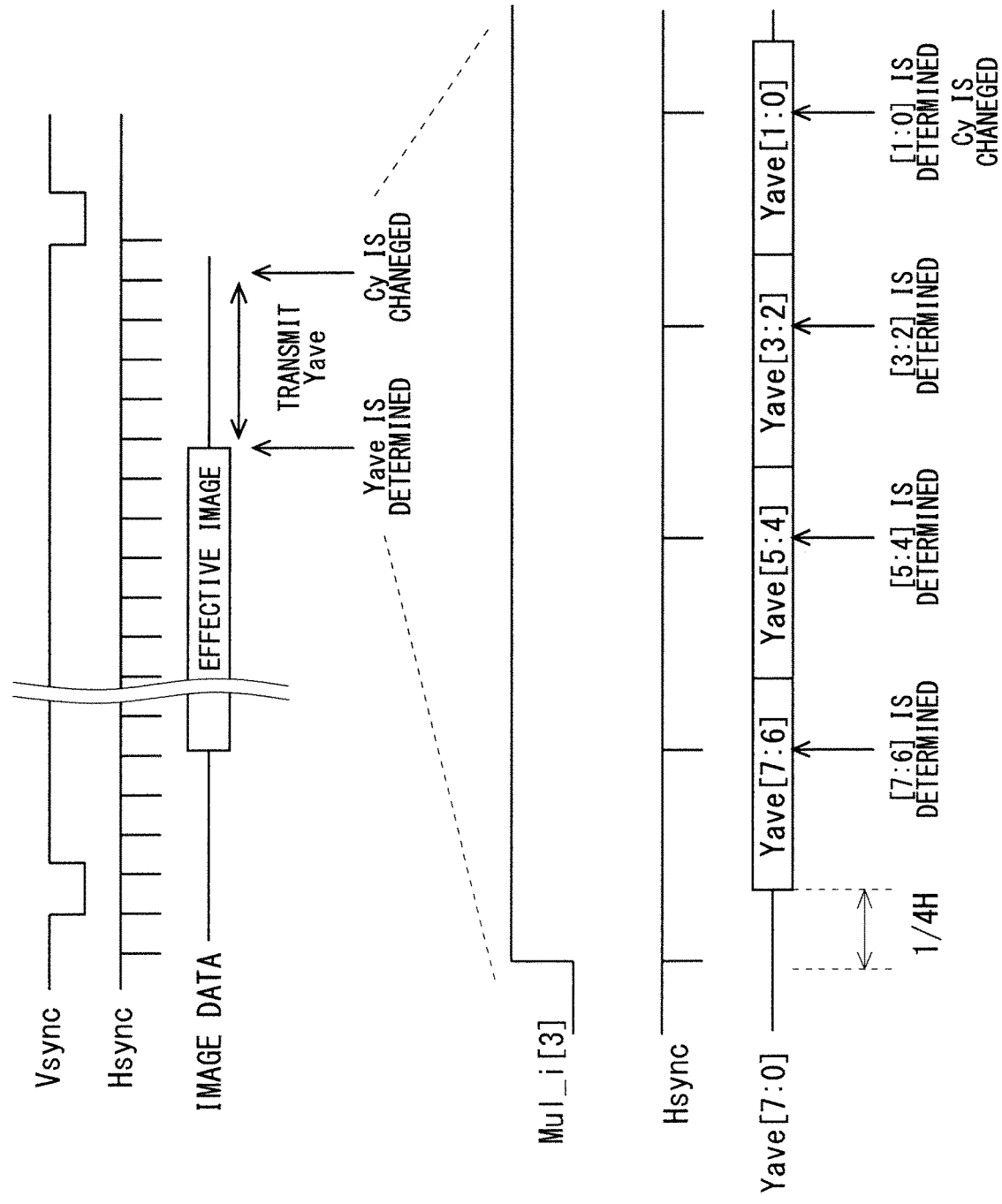
[FIG. 7] An explanatory diagram for explaining timing for calculating a common brightness correction coefficient based on an average brightness value input via a signal line.
Figure 8:
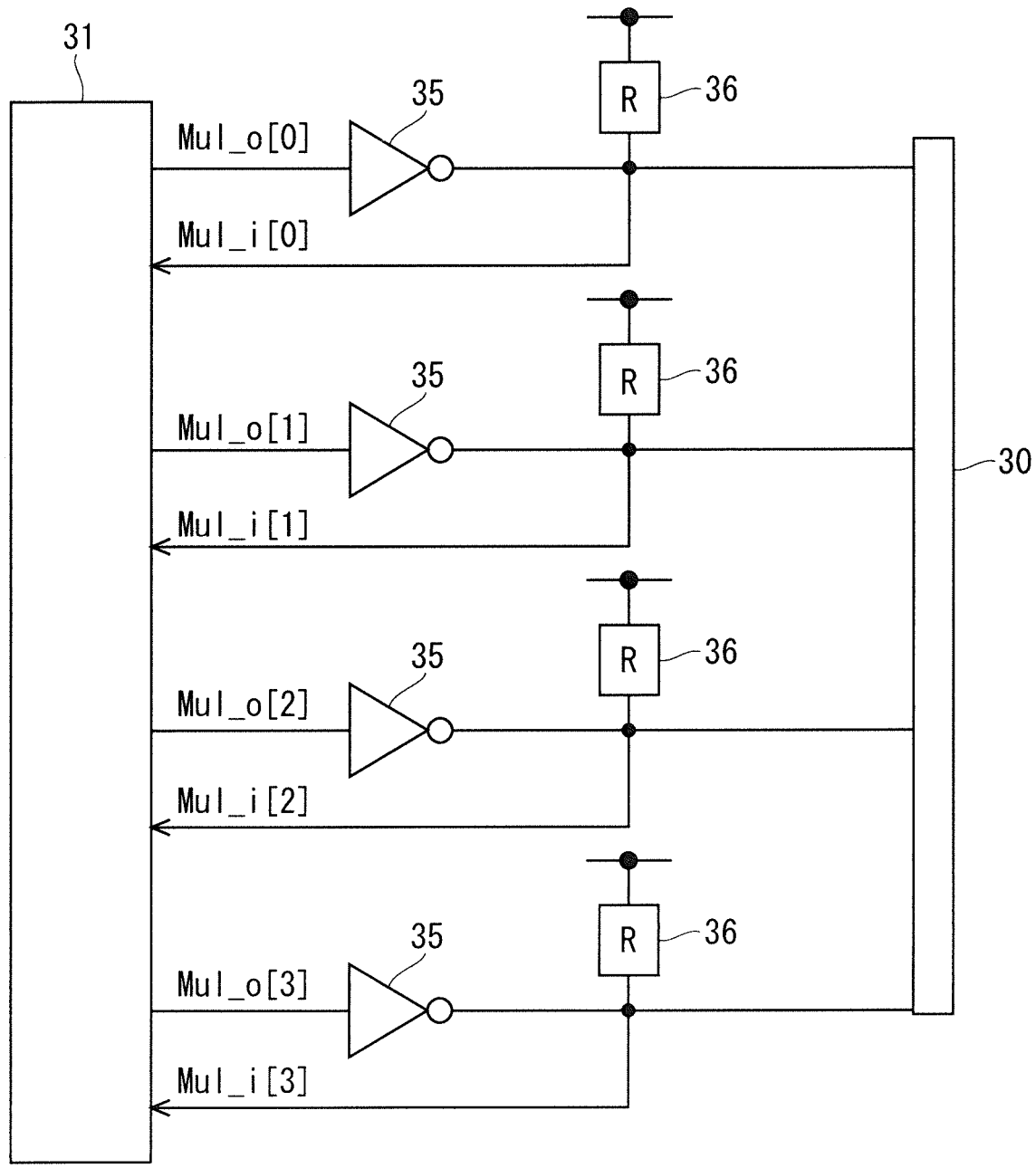
[FIG. 8] A circuit diagram illustrating around an average brightness value communication unit.

Next, a power saving control method in the case where the LED display system 300A having a pixel number of 1920× 1080 or more is configured by a plurality of controllers 200 and a plurality of LED units 101 will be described. FIG. 5 is a configuration diagram of an LED display system 300A including a plurality of controllers 200. FIG. 6 is diagram illustrating an example of a vertical synchronization signal Vsync and a horizontal synchronization signal Hsync in the controller 200. FIG. 7 is an explanatory diagram for explaining timing for calculating a common brightness correction coefficient Cy based on an average brightness value Yave input via a signal line. FIG. 8 is a circuit diagram illustrating around an average brightness value communication unit 31.

For example, as shown in FIG. 5, four controllers 200a, 200b, 200c, and 200d and four LED units 101a, 101b, 101c, and 101d are connected to each other to form an LED display system 300A with a size of 7680×1080 pixels. In this case, each of the controllers 200a, 200b, 200c, and 200d controls each of the LED units 101a, 101b, 101c, 101d through the processing of the video signal in synchronization with the external synchronization signal input via the external synchronization signal input/output terminal 32 (see FIG. 3) in the video signal processing circuit 11. Further, the average brightness value Yave calculated by each of the controllers 200a, 200b, 200c, and 200d is shared among the controllers 200a, 200b, 200c, and 200d by wired-OR connecting the signal lines via the average brightness value input/output terminals 30 (see FIG. 3).

Here, the external synchronization signal input via the external synchronization signal input/output terminal 32 is capable of synchronizing outputs of the four controllers 200a, 200b, 200c, and 200d by, for example, outputting an external synchronization signal generated in the controller 200a to the rest of the three controllers 200b, 200c, and 200d. In practice, as shown in FIG. 6, when a common external synchronization signal is input to each of the controllers 200a, 200b, 200c, and 200d via the external synchronization signal input/output terminal 32, the vertical synchronization signal Vsync and the horizontal synchronization signal Hsync are generated in respective video signal processing circuits 11. In this case, each controller 200a, 200b, 200c, and 200d generates the vertical synchronization signal Vsync so that the period of the horizontal synchronization signal Hsync is successive. Therefore, after the external synchronization signal is input, the vertical synchronization signal Vsync is output in synchronization with the horizontal synchronization signal Hsync generated internally first.

In the case of FIG. 5, for example, by outputting the external synchronization signal generated by the controller 200a to the rest of three controllers 200b, 200c, and 200d, the outputs of all four controllers 200a, 200b, 200c, and 200d are synchronized at the timing shown in FIG. 6. Here, in each of the controllers 200a, 200b, 200c, and 200d, the vertical synchronization signal Vsync is generated so that the period of the horizontal synchronization signal Hsync is successive; therefore, the horizontal synchronization signal Hsync and the vertical synchronization signal Vsync of all of the controllers 200a, 200b, 200c, and 200d do not completely coincide with each other, but as shown in FIG. 6, are shifted from each other by a maximum of 1H period.

Next, the operation of the average brightness value communication unit 31 will be described. The average brightness value communication unit 31 receives the average brightness value Yave from the correction coefficient calculation unit 25. As shown in FIG. 6, the average brightness value Yave is determined when all the effective images are output. The average brightness value communication unit 31 transmits the average brightness value Yave with 8 bits.

As shown in FIG. 7, the average brightness value communication unit 31 divides the average brightness value Yave [7:0] into four and for the front porch 4H period of the video signal and transmits the values. In practice, each of the controllers 200a, 200b, 200c, and 200d is wired-OR connected by four signal lines Mul_i [3:0]. As shown in FIG. 6, the outputs of the controllers 200a, 200b, 200c, and 200d are shifted by a maximum of 1H period. For this reason, each of the controllers 200a, 200b, 200c, 200d asserts information (hereinafter referred to as a "READY signal") that indicates whether the correction coefficient calculation unit 25 is calculating or waiting. When the average brightness value Yave [7:0] of all the controllers 200a, 200b, 200c, and 200d is determined, the average brightness value Yave [7:0] is divided into four and sequentially output from each of the controllers 200a, 200b, 200c, and 200d at a constant period. That is, the average brightness value communication unit 31 transmits Yave [7:6] on the first line of the front porch, and sequentially transmits Yave [5:4], Yave [3:2], and Yave [1:0] in this order.

Further, the average brightness value communication unit 31 encodes and transmits 2-bit data and the READY signal to the four signal lines Mul_o [3:0]. A signal line corresponding to each bit of the signal line Mul_o [3:0] is wired-OR connected to a signal line corresponding to each bit of the signal line Mul_o [3:0] of another controller via the average brightness value input/output terminal 30.

In practice, as shown in FIG. 8, a digital transistor 35 and a pull-up resistor 36 are connected to the signal line corresponding to each bit of the signal line Mul_o [3:0].

When an "H" signal is input to the digital transistor 35, an "L" signal is output, and when the "L" signal is input, the impedance becomes high; therefore, if even one of the controllers 200a, 200b, 200c, and 200d outputs "L" for a signal line corresponding to a certain bit, the signal line becomes "L". In other cases, the signal line is "H".

The average brightness value communication unit 31 assigns the READY signal to the signal line Mul_o [3], assigns the 2-bit data to the three signal lines Mul_o [2:0], and encodes them as follows.

When processing is in progress, Mul_o [3]=1.
When in standby, Mul_o [3]=0.
When Yave [7:6]=11, Mul_o [2:0]="100"
When Yave [7:6]=10, Mul_o [2:0]="010"
When Yave [7:6]=01, Mul_o [2:0]="001"
When Yave [7:6]=00, Mul_o [2:0]="000"
Here, the case of Yave [7:6] is shown.

The signal line Mul_i [3] (=READY signal) is "L" if even one of the four connected controllers 200a, 200b, 200c, 200d is "processing in progress", and if all the controllers 200a, 200b, 200c, and 200d are "standby", the signal line Mul_i [3] (=READY signal) is "H". As shown in FIG. 7, each controller 200a, 200b, 200c, 200d uses timing at which Mul_i [3]=H in the average brightness value communication unit 31 as a trigger to generate an internal reference signal at a constant period interval H (for example, H=2200 (clock)), synchronizes with this reference signal H, and outputs the signal after dividing the output of the average brightness value Yave [7:0] into four. Note that Mul_i [3]=H, that is, the READY signal=H corresponds to a control signal indicating completion of calculation of the average brightness value Yave.

In practice, the four controllers 200a, 200b, 200c, and 200d output the average brightness value Yave [7:0], at a delay of ¼ period from Hsync, to the signal line Mul_o [2:0], and the average brightness value communication unit 31 takes in the transmission results Mul_i [2:0] from the four controllers 200a, 200b, 200c, and 200d at the next Hsync timing. The transmission results by the four controllers 200a, 200b, 200c, and 200d is the maximum value of the average brightness value Yave [7:0] of the four controllers 200a, 200b, 200c, and 200d.

Here, in each controller 200a, 200b, 200c, and 200d, Yave'[7:6] decoded from Mul_o [2:0] determined in the first line of the front porch and its own Yave [7:6] are compared. when Yave [7:6]<Yave'[7:6],
Yave [7:6]=Yave'[7:6], Yave [5:0]="000000" is set, and when Yave [7:6]>Yave'[7:6], Yave [7:0] is not changed.

In other words, if decoded Yave'[7:6] is larger than its own Yave [7:6], the correct maximum value can be obtained by comparing [5:0] bits by setting its own Yave [5:0]=0.
During decoding, fraction processing is performed so that Yave'[7:6] is any one of "100", "010", "001", and "000".
Similarly, in the second line of the front porch, when Yave [5:4]<Yave'[5:4],
Yave [5:4]=Yave'[5:4], Yave [3:0]="0000" is set, and when Yave [5:4]≥Yave'[5:4], Yave [5:0] is not changed.
In the third line of the front porch, when Yave [3:2]<Yave'[3:2],
Yave [3:2]=Yave'[3:2], Yave [1:0]="00" is set, and when Yave [3:2]≥Yave'[3:2], Yave [3:0] is not changed.
Lastly, in the fourth line of the front porch, when Yave [1:0]<Yave'[1:0],
Yave [1:0]=Yave'[1:0], is set, and when Yave [1:0]≥Yave'[1:0], Yave [1:0] is not changed.

As described above, Yave [7:0], which is the maximum in each controller 200a, 200b, 200c, and 200d by repeating transmission by 2 bits, can be shared in each controller 200a, 200b, 200c, and 200d. Further, as shown in FIG. 6, the brightness correction coefficient Cy is changed after Yave [7:0] is determined at Hsync on the fifth line of the front porch.

As described above, the brightness correction coefficient Cy is changed in each of the controllers 200a, 200b, 200c, and 200d, but the brightness correction coefficient Cy is calculated based on the common average brightness value Yave [7:0]; therefore, the brightness correction coefficients Cy are the same. That is, the brightness correction coefficient Cy common to the controllers 200a, 200b, 200c, and 200d is calculated.

In the above, the 8-bit average brightness value Yave [7:0] is divided into four times and transmitted among the controllers 200a, 200b, 200c, and 200d, but the number of transmission lines and the accuracy of the average brightness value Yave shown in FIG. 7 may be divided and transmitted with an arbitrary number of bits. For example, the average brightness value Yave may be divided by two and transmitted by 4 bits with 8 bits of accuracy and 15 transmission lines. Furthermore, although the transmission data transmitted among the controllers 200a, 200b, 200c, and 200d transmits the average brightness value Yave, the brightness correction coefficient Cy may be transmitted. However, in the case of the brightness correction coefficient Cy, it is necessary to select the brightness correction coefficient Cy that is the smallest among the controllers 200a, 200b, 200c, and 200d.

Figure 9:
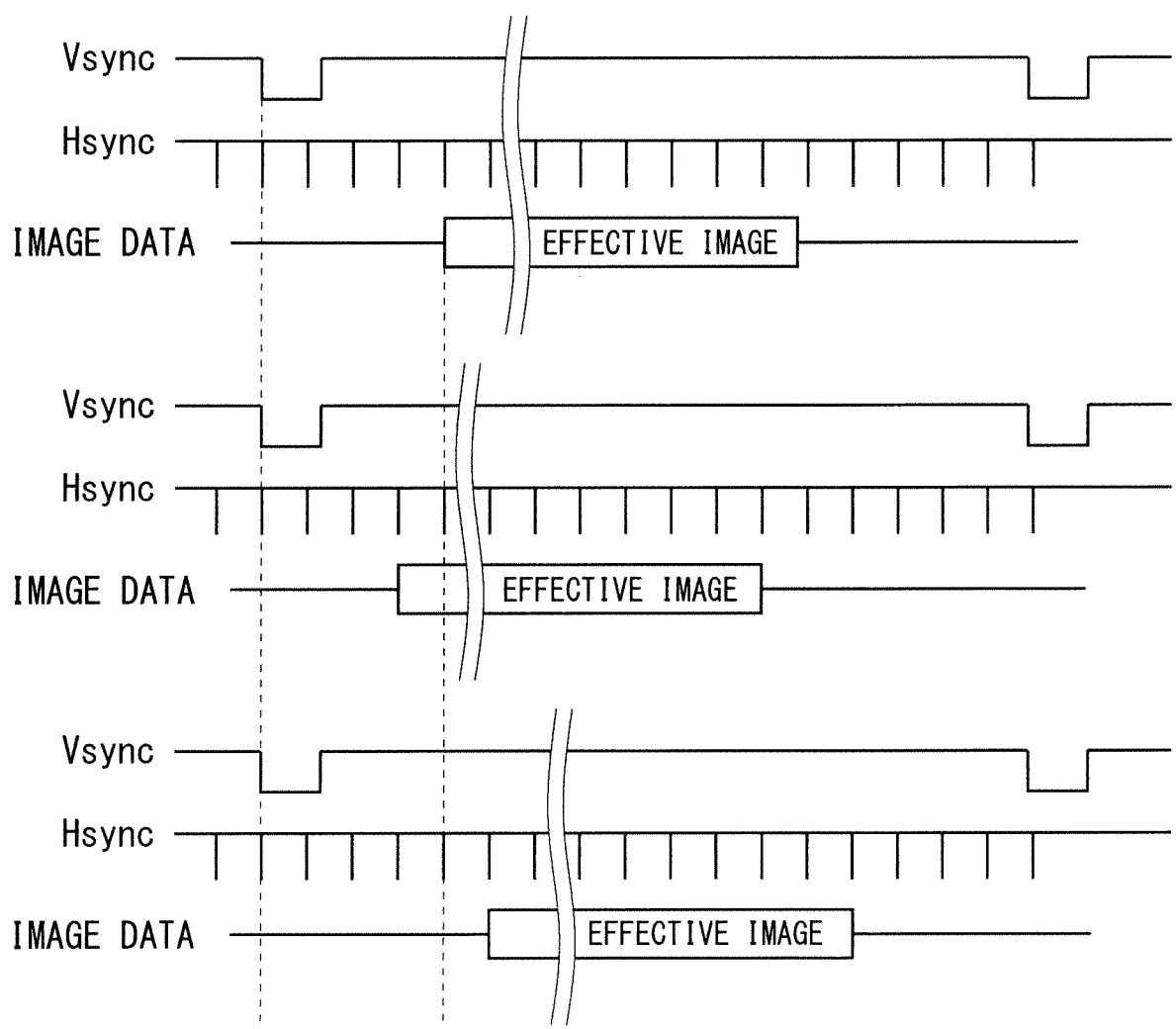
[FIG. 9] A diagram illustrating an example of a vertical synchronization signal and a horizontal synchronization signal in the controller.

In the above, the reference signal H necessary for outputting the average brightness value Yave [7:0] in the controllers 200a, 200b, 200c, and 200d is internally generated using all READY signals, and the average brightness value Yave [7:0] is time-shared and transmitted in synchronization with the reference signal H. However, when the external synchronization signal is input in each controller 200a, 200b, 200c, and 200d, thereby the horizontal synchronization signal Hsync and the vertical synchronization signal Vsync are forcibly reset and output, the horizontal synchronization signal Hsync and the vertical synchronization signal Vsync of all the LED units 101a, 101b, 101c, and 101d are synchronized; therefore, the average brightness value Yave [7:0] may be transmitted in synchronization with the horizontal synchronization signal Hsync in each of the controllers 200a, 200b, 200c, and 200d. As shown in FIG. 9, the average brightness value Yave [7:0] can be synchronized and transmitted even when the output timing of the effective image region of the output video generated in each controllers 200a, 200b, 200c, and 200d is different.

In this case, as shown in FIG. 10, each of the controllers 200a, 200b, 200c, and 200d time-shares and outputs the READY signal and the average luminance value Yave [7:0] in synchronization with the next horizontal synchronization signal Hsync in which the average brightness value Yave [7:0] is determined. For example, in FIG. 10, Mul_o [3]=L and Yave [7:6] are output at ¼ period timing after the average brightness value Yave [7:0] is determined, and if the READY signal is L at the next Hsync period, the average brightness value Yave [7:0] of other controllers has not been determined; therefore, Yave [7:6] is continuously output. When the READY signal is H, Yave [7:6] may be taken in and controlled to output Yave [5:4], Yave [3:2], Yave [1:0] sequentially at the timing shown in FIG. 10.

As described above, a common synchronization signal is input to each of the controllers 200a, 200b, 200c, and 200d, and the average brightness value Yave [7:0] is transmitted through the wired-OR connected signal line Mul_o [2:0]. By doing so, the controllers 200a, 200b, 200c, and 200d can be controlled with the brightness correction coefficient Cy common to the controllers 200a, 200b, 200c, and 200d. Therefore, it can be suppressed that the power control differs for each controller, and the brightness control of the single LED units 100 connected to them is varied, leading to the occurrence of a brightness difference in the entire LED display system 300A.

Further, the average brightness value Yave [7:0] is divided and transmitted using the wired-OR connected signal line Mul_o [2:0]; therefore, the controllers 200a, 200b, 200c, and 200d can be connected with a small number of signal lines. Further, when the number of bits of the average brightness value Yave is small, intervals of the power saving control become rough. Therefore, when the average brightness value Yave is switched, the brightness of the single LED unit 100 after the correction greatly changes, so that the flicker of the screen can be visually recognized. However, according to Embodiment 1, when the average brightness value Yave is 8 bits, control in 256 processes is possible, and flickering of the screen at the time of switching power saving control can be suppressed.

Although, transmission of the average brightness value Yave among the controllers 200a, 200b, 200c, and 200d can be controlled by a microcomputer or the like by communication means such as a LAN, this complicates an algorithm for synchronizing the average brightness value Yave. However, in the case where the transmission is performed using the signal line Mul_o [2:0] connected by wired OR as in Embodiment 1, the average brightness value Yave can be easily and reliably synchronized.

(Effect)

As described above, in the LED display system 300A according to Embodiment 1, after the completion of calculation of the average brightness value Yave for all the controllers 200a, 200b, 200c, and 200d by the READY signal is detected, each controller 200a, 200b, 200c, and 200d outputs the average brightness value Yave to the signal line Mul_o [2:0], and calculates the brightness correction coefficient Cy common to all the controllers 200a, 200b, 200c, and 200d for correcting the brightness of the video signal such that the power consumption of the single LED unit 100 becomes equal to or lower than a predetermined value. The single LED unit 100 adjusts the brightness of the video signal based on the common brightness correction coefficient Cy calculated in each of the controllers 200a, 200b, 200c, and 200d. Thereby, even when a plurality of single LED units 100 are provided, the power consumption control by the controllers 200a, 200b, 200c, and 200d can be synchronized to suppress the power consumption to equal to or lower than a predetermined value.

As described above, energy consumption in the LED display system 300A can be reduced.

Further, the power saving control by the controllers 200a, 200b, 200c, and 200d can be performed using the common brightness correction coefficient Cy; therefore, it can be suppressed that the power control differs for each controllers 200a, 200b, 200c, and 200d, and the brightness control of the single LED units 100 connected to them is varied, leading to the occurrence of a brightness difference in the entire LED display system 300A.

Furthermore, the READY signal that synchronizes the output timing of the average brightness value Yave generated among the controllers 200a, 200b, 200c, and 200d is transmitted using a wired-OR connected signal line; therefore, the average brightness values Yave generated among the respective controllers 200a, 200b, 200c, and 200d, can be accurately synchronized.

After detecting the completion of calculation of the average brightness value Yave of all the controllers 200a, 200b, 200c, and 200d by the READY signal, the average brightness value communication unit 31 in each controllers 200a, 200b, 200c, and 200d time-divides and outputs the average brightness value Yave to the signal line Mul_o [2:0].

Accordingly, the multi-bit average brightness value Yave can be transmitted with a small number of control lines; therefore, the accuracy of power saving control can be improved.

EMBODIMENT 2

Next, an LED display system 300A according to Embodiment 2 will be described. Note that in Embodiment 2, the same components as those described in Embodiment 1 are denoted by the same reference numerals, and description thereof is omitted.

In the Embodiment 1, although the common external synchronization signal is input in FIG. 5 and control is performed to synchronize the outputs of all the controllers 200a, 200b, 200c, and 200d as shown in FIG. 6, it may also have a configuration, in each of the 200a, 200b, 200c, and 200d, including a mode in which power saving control is performed in synchronization with the common external synchronization signal shown in FIG. 5 and FIG. 6 and a mode in which power saving control is individually performed.

In the mode in which the power saving control is performed individually, after the completion of calculation of the average brightness value Yave for all the controllers 200a, 200b, 200c, and 200d by the READY signal is detected, the average brightness value communication unit 31 may output Mul_o [2:0]="000" so as not to drive the signal line Mul_o [2:0] connected by wired OR, and calculate the brightness correction coefficient Cy based on the average brightness value Yave [7:0] calculated by the unit per se. In this case, the signal line Mul_o [2:0]="000" is output; therefore, the wired-OR connected signal line Mul_o [2:0] is not driven. Therefore, the average brightness value Yave [7:0] of other controller is not affected. Specifically, a controller that performs power saving control individually, outputs Yave [7:0]=0 (minimum value of the average brightness value) to other controllers regardless of the calculated average brightness value Yave [7:0].

By performing such control, a controller to be synchronized on power saving control can be arbitrarily selected in a state where a common external synchronization signal is input to the controller and the signal line Mul_o [2:0] is wired-OR connected. In this case, some controllers are not synchronized with the common external synchronization signal, but are synchronized with a video signal input from the video input terminal 10, or for the controllers that do not require synchronization among a plurality of controllers, power saving control can be performed individually, In other words, when an output image of the controller is a display having no correlation with the other controllers, power saving control can be performed in a spontaneous manner without being affected by the power saving control in the other controllers.

(Effect)

As described above, in the LED display system 300A according to Embodiment 2, when the brightness of the video signal distributed from the video signal distribution unit 14 is not adjusted based on the common brightness correction coefficient Cy, the average brightness value communication unit 31 does not drive the signal line Mul_o [2:0]. That is, the signal line Mul_o [2:0]="000" is output.

Accordingly, when an output image of the controller is a display having no correlation with the other controllers , power saving control can be performed in a spontaneous manner without being affected by the power saving control in the other controllers.

While the invention has been described in detail, the foregoing description is in all aspects illustrative and not restrictive. It is understood that numerous other modifications and variations can be devised without departing from the scope of the invention.

It should be noted that Embodiments of the present invention can be arbitrarily combined and can be appropriately modified or omitted without departing from the scope of the invention.

EXPLANATION OF REFERENCE SIGNS

1 LED, 4 LED drive unit, 9 brightness adjustment unit, 14 video signal distribution unit, 24 average brightness calculation unit, 25 correction coefficient calculation unit, 31 average brightness value communication unit, 100, 100a, 100b, 100c, 100d single LED unit, 200, 200a, 200b, 200c, 200d controller, 300, 300A LED display system

The invention claimed is:

1. An LED display system comprising a plurality of controllers and an LED display device configured to display a video based on a video signal distributed from the plurality of controllers, wherein
    each of the controllers includes
        a control circuit configured to calculate an average brightness value of pixels constituting a frame for each frame in the video signal and generate a control signal indicating completion of calculation of the average brightness value,
        a signal line wired-OR connected to the other controllers, and
        an average brightness value communication unit configured to share the average brightness value and the control signal with the other controllers via the signal line and output the average brightness value to the signal line after detecting the completion of calculation of the average brightness values of all the controllers by the control signal,
    the control circuit calculates a brightness correction coefficient common to all the controllers for correcting the brightness of the video signal so that power consumption of the LED display device becomes equal to or lower than a predetermined value based on the average brightness value input from the average brightness value communication unit via the signal line,
    each of the controllers further comprises a video signal distribution unit configured to distribute the video signal and the common brightness correction coefficient to the LED display device,
    the video signal distribution unit is configured to add the common brightness correction coefficient to a head of (n+1)th frame which is a next frame of an nth frame, the average luminance value of which has been obtained, and
    the LED display device includes
        a plurality of LEDs serving as display pixels,
        a frame memory configured to delay the video signal of the nth frame distributed from the video signal distribution unit for one frame and output thereof,
        a brightness adjustment unit configured to adjust the brightness of the video signal of the nth frame delayed for one frame by the frame memory and output based on the common brightness correction coefficient added to the head of the (n+1)th frame distributed from the video signal distribution unit, and
        an LED drive unit configured to drive the plurality of LEDs based on the video signal of which brightness has been adjusted by the brightness adjustment unit.

2. The LED display system according to claim L wherein in each of the controllers, the average brightness value communication unit is configured to time-divide and output the average brightness value to the signal line after detecting the completion of calculation of the average brightness values of all the controllers by the control signal.

3. The LED display system according to claim 1, wherein when the brightness of the video signal distributed from the video signal distribution unit is not adjusted based on the common brightness correction coefficient, the average brightness value communication unit is configured not to drive the signal line.

4. An LED display device which the LED display system according to claim 1 comprises.

* * * * *